(12) United States Patent
Mihnea et al.

(10) Patent No.: US 7,215,571 B2
(45) Date of Patent: *May 8, 2007

(54) METHOD FOR REDUCING DRAIN DISTURB IN PROGRAMMING

(75) Inventors: Andrei Mihnea, Boise, ID (US); Vinod Lakhani, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/931,689

(22) Filed: Sep. 1, 2004
(Under 37 CFR 1.47)

(65) Prior Publication Data
US 2005/0041468 A1    Feb. 24, 2005

Related U.S. Application Data

(63) Continuation of application No. 10/230,927, filed on Aug. 29, 2002, now Pat. No. 6,798,694.

(51) Int. Cl.
*G11C 11/34* (2006.01)
*G11C 16/04* (2006.01)

(52) U.S. Cl. .......................... 365/185.01; 365/185.14; 365/185.33

(58) Field of Classification Search ........... 365/185.01, 365/185.14, 185.26, 185.33; 356/185.02
See application file for complete search history.

(56) References Cited

U.S. PATENT DOCUMENTS

| | | | |
|---|---|---|---|
| 5,317,535 A * | 5/1994 | Talreja et al. .......... | 365/185.02 |
| 5,491,657 A | 2/1996 | Haddad et al. | |
| 5,612,913 A | 3/1997 | Cappelletti et al. | |
| 5,912,837 A * | 6/1999 | Lakhani ................. | 365/185.02 |
| 6,091,632 A * | 7/2000 | Yoshimi et al. ........ | 365/185.11 |
| 6,232,634 B1 | 5/2001 | Wu et al. | |
| 6,272,047 B1 | 8/2001 | Mihnea et al. | |
| 6,295,229 B1 | 9/2001 | Chang et al. | |
| 6,359,821 B1 | 3/2002 | Roohparvar | |
| 6,449,187 B1 | 9/2002 | Salling et al. | |
| 6,496,434 B1 | 12/2002 | Nobunaga | |
| 6,563,741 B2 | 5/2003 | Mihnea et al. | |
| 6,798,694 B2 * | 9/2004 | Mihnea et al. ......... | 365/185.01 |

* cited by examiner

*Primary Examiner*—Son Dinh
*Assistant Examiner*—Toan Le
(74) *Attorney, Agent, or Firm*—Leffert Jay & Polglaze, P.A.

(57) ABSTRACT

For a multi-sectored flash memory array with bitlines spanning multiple erase blocks, a bias scheme for programming an address in any erase sector while minimizing drain voltage induced disturb to cells in unselected erase sectors sharing the same bitlines.

15 Claims, 3 Drawing Sheets

METHOD FOR REDUCING DRAIN DISTURB IN PROGRAMMING

RELATED APPLICATIONS

This application is a continuation of U.S. patent application Ser. No. 10/230,927, filed Aug. 29, 2002 now U.S. Pat. No. 6,798,694 and titled, "METHOD FOR REDUCING DRAIN DISTURB IN PROGRAMMING," which is commonly assigned and incorporated by reference in its entirety herein.

FIELD

The present invention relates generally to memory devices and in particular the present invention relates to reduction of drain stress in memory devices.

BACKGROUND

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicates a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and can also made of doped polysilicon. The control gate is electrically separated from the floating gate by another dielectric layer. Thus, the floating gate is "floating" in dielectric so that it is insulated from both the channel and the control gate.

In flash memories of current design, block erase functions are used to erase selected blocks of the memory. This is accomplished as is known in the art by splitting a common diffused source, formerly for an entire memory array, into source blocks of predetermined size. This size is dependent upon the function of the memory. Each block of a memory array of this type is independently erasable.

To erase a block, a first voltage value is applied on the source of the selected block, a second voltage value is applied on all the control gates (wordlines) of the selected block, the substrate is grounded and the drains for all the cells (bitlines) are allowed to float. The first voltage applied on the source is in the range 0 to 12 V. The second voltage applied on control gates is in the range of −12 V to 0. In certain array architectures, multiple source blocks are stacked along a single bitline, that is, one bitline is connected to multiple erase blocks. In this configuration, the drains of the cells in several blocks are shared. Non-selected blocks, then, face a drain stress because they have a voltage on the drain that is used in programming selected blocks, but is still present because of the shared bitline on non-selected blocks.

Further, there is a potential problem of current leakage in columns, due to the common source and the voltages typically placed on source, drain, and gate during programming. Current may leak from the source of the unselected block to the source of the selected block sue to the voltage differences between the two sources.

For the reasons stated above, and for other reasons stated below which will become apparent to those skilled in the art upon reading and understanding the present specification, there is a need in the art for reducing the drain stress on non-selected cells in a flash memory program operation.

SUMMARY

The above-mentioned problems with drain disturb and soft programming in flash memories and other problems are addressed by the present invention and will be understood by reading and studying the following specification.

In one embodiment, a method of programming a flash memory includes reducing drain stress on unselected blocks in the memory during programming, and reducing current leakage from unselected source blocks to selected source blocks during programming.

In another embodiment, a method of programming a flash memory includes selecting blocks of the memory having cells to be programmed, and applying potentials to the various inputs of the memory. The potentials are approximately 4 volts to 5 volts above a main memory ground potential to selected bitlines, approximately 1.5 volts to 2.5 volts above the main memory ground potential to source regions and wordlines of cells in non-selected blocks, approximately 0.5 volts to 2.5 volts above the main memory ground potential to non-selected bitlines, approximately 0.5 volts to 2 volts above the main memory ground potential to source regions of selected blocks, and approximately 0 volts to 2 volts above the main memory ground potential to non-selected wordlines in selected blocks.

In yet another embodiment, a memory device includes an array of non-volatile memory cells arranged in a patterns of rows and columns, a number of wordlines each connected to multiple cells in a row of cells, a number of bitlines each connected to multiple cells in a column of cells, and control circuitry to adjust voltages on memory array inputs during a programming function.

In still another embodiment, a flash memory device includes an array of floating gate memory cells, and control circuitry to read, write and erase the floating gate memory cells. The control circuitry includes a command module to adjust voltages on memory array inputs during a programming function.

In still yet another embodiment, a processing system includes a processor and a memory device coupled to the processor to store data provided by the processor and to provide data to the processor. The memory device includes an array of non-volatile memory cells arranged in a patterns of rows and columns, a number of wordlines each connected to multiple cells in a row of cells, a number of bitlines each connected to multiple cells in a column of cells, and control circuitry to adjust voltages on memory array inputs during a programming function.

Other embodiments are described and claimed.

DETAILED DESCRIPTION

Figure 1:
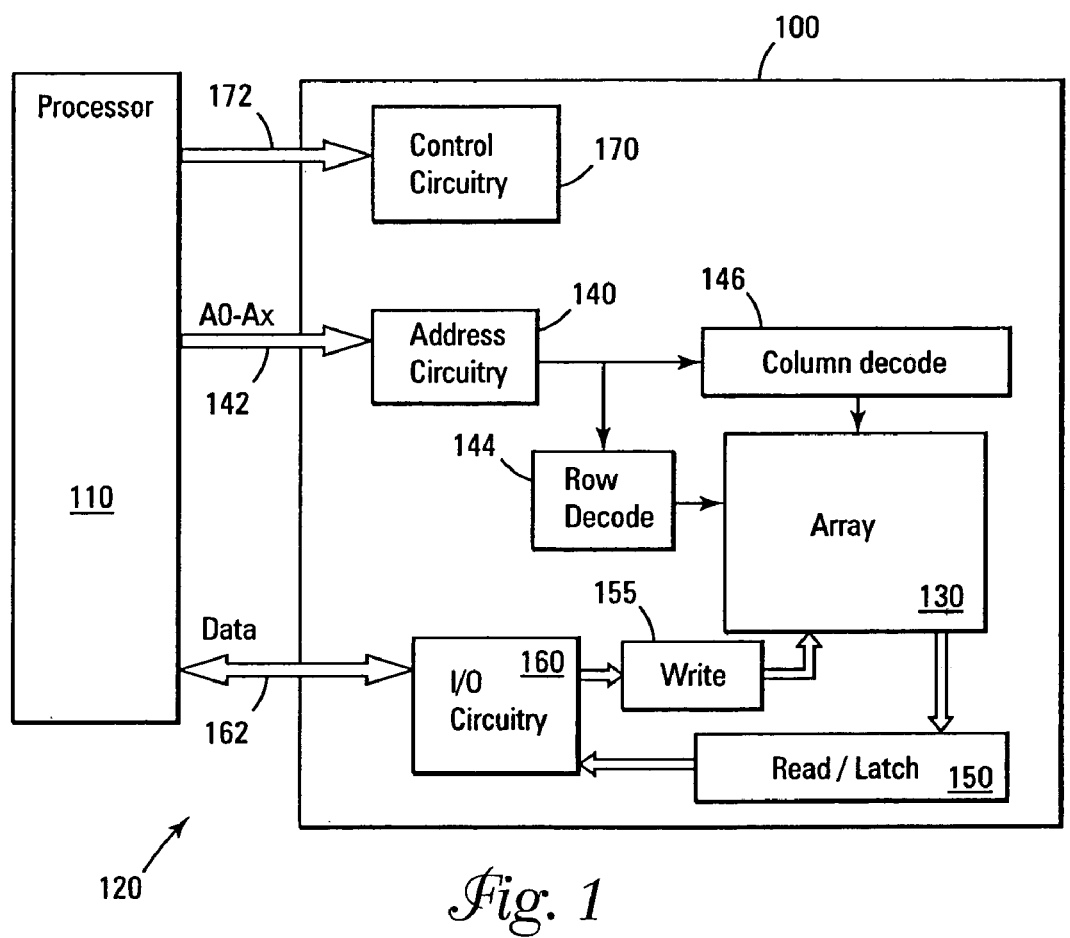
FIG. 1 is a block diagram of a memory device on which embodiments of the present invention are practiced.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The following detailed description is, therefore, not to be taken in a limiting sense, and the scope of the present invention is defined only by the appended claims, along with the full scope of equivalents to which such claims are entitled.

FIG. 1 is a functional block diagram of a memory device 100, of one embodiment of the present invention, which is coupled to a processor 110. The memory device 100 and the processor 110 may form part of an electronic system 120. The memory device 100 has been simplified to focus on features of the memory that are helpful in understanding the present invention. The memory device includes an array of memory cells 130. The memory array 130 is arranged in banks of rows and columns.

An address buffer circuit 140 is provided to condition and/or latch address signals provided on address input connections A0–Ax 142. Address signals are received and decoded by row decoder 144 and a column decoder 146 to access the memory array 130. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 130 by sensing voltage or current changes in the memory array columns using sense/latch circuitry 150. The sense/latch circuitry, in one embodiment, is coupled to read and latch a row of data from the memory array. Data input and output buffer circuitry 160 is included for bi-directional data communication over a plurality of data (DQ) connections 162 with the processor 110.

Command control circuit 170 decodes signals provided on control connections 172 from the processor 110. These signals are used to control the operations on the memory array 130, including data read, data write, and erase operations. The flash memory device has been simplified to facilitate a basic understanding of the features of the memory. A more detailed understanding of internal circuitry and functions of flash memories are known to those skilled in the art.

The memory array can be arranged in a plurality of addressable banks. Each bank of the memory array can be divided into numerous blocks of non-volatile memory cells. Each block of cells can be erased during a common erase operation. The memory cells in the blocks are arranged in rows and columns, similar to a DRAM. The rows are defined by wordlines that form the control gates of the non-volatile memory cells. Bit lines that are connected to the drain of the memory cells define the columns of the memory array.

In a program cycle in flash memories of the architecture shown, the various voltages on selected blocks and unselected blocks can lead to drain disturb and current leakage as has been discussed above. To combat these problems, one embodiment of the present invention reduces drain stress to unselected blocks in a flash memory programming operation. Another embodiment of the present invention reduces current leakage from an unselected source block to a selected source block. The embodiments of the present invention accomplish the reductions by controlling the various voltages on drains, sources, gates, and substrates of the selected and unselected blocks. The embodiments of the present invention are directed to the discharge of the precondition voltage placed on the global bitlines during a read cycle before a programming cycle of a flash memory.

Flash memories with small erase block sizes have been constructed in the standard flash memory architecture that uses separate source block electric lines for the erase blocks, each line feeding the source voltage to all the flash cells in the respective erase block. Memory arrays have been built based on this approach, in which the drains of a number of cells arranged on a geometrical column spanning several different erase blocks are all connected to a common metal line called a bitline. In such arrays, the cells in unselected blocks experience drain stress due to the voltage applied on the selected bitlines (carrying data=0) while the cells in an erase block are being programmed. Such drain stress may result in data disturbance or soft programming of cells in unselected blocks during the exercise of legitimate programming functions on the selected block.

Figure 2:
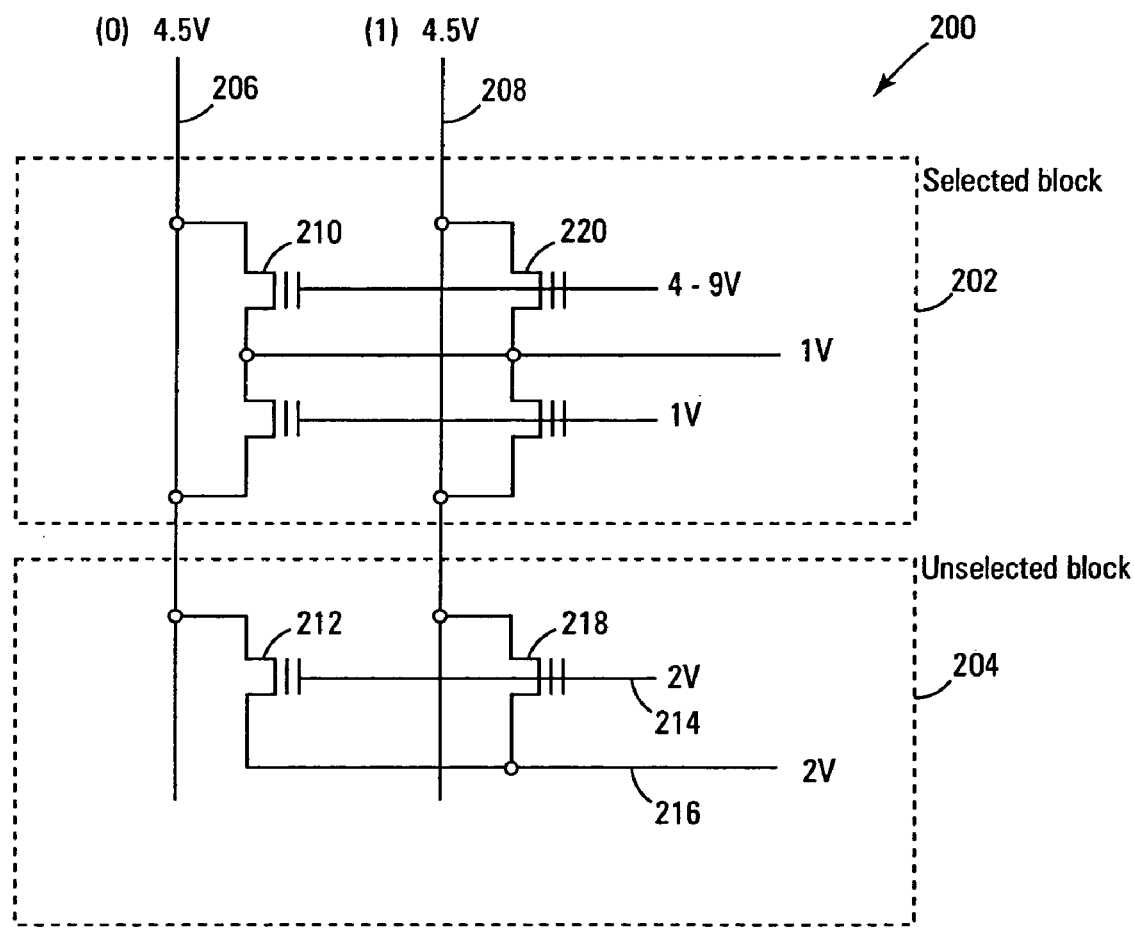
FIG. 2 is a circuit diagram of a portion of a memory according to one embodiment of the present invention.

In one embodiment, a circuit representation 200 in which voltages are applied to the various inputs of the selected and unselected blocks for reducing drain stress on unselected blocks in a flash memory is shown in circuit diagram in FIG. 2. In this source bias embodiment, the voltage of the substrate is held at ground by applying a voltage of zero on the common p substrate. All voltage values referred to with respect to FIG. 2 are applied on the respective circuit lines with reference above the main ground line of the circuit. In this embodiment, all the voltages with the exception of the bitline voltage for selected wordlines and bitlines are derived from the main power supply to the circuit (Vcc) to avoid excessive loading of the current pump supplying the program voltage to the selected bitlines.

Block 202 is a selected block which is to be programmed in a programming operation. Block 204 is an unselected block sharing common bitlines 206 and 208 with block 202 for programming the blocks. Suppose cell 210 of selected block 202 is to be programmed on bitline 206 which carries data equal to zero (0). A typical programming voltage for that bitline, to program multiple cells, is 4.5 volts. The 4.5 volts on bitline 206 is also applied to cell 212 of unselected block 204, which shares the common bitline 206. In previous programming operations, the wordline 214 of the unselected block 204 would have a zero voltage. With 4.5 volts on the bitline 206, and zero volts on the unselected block wordline 214, the drain to gate voltage is on the order of 4.5 volts, which creates drain to gate stress. In this embodiment, the wordline voltage for wordline 214 of unselected block 204 is raised to 2 volts to reduce the drain to gate stress. The drain to gate voltage of 2.5 volts instead of 4.5 volts addresses the problem of drain disturb on unselected cells.

Raising the gate voltage of unselected cells, for example cell 212 of block 204, turns the cell on. This is unwanted, so in this embodiment, the source voltage of the cell is also raised to 2 volts, as is shown on the source line 216. This assures that the cell 212 in the unselected block 204 remains off and not conducting. A feature of flash memories of the type described herein is that all threshold voltages for the cells in the array are greater than zero under all conditions. This helps to avoid the effects of column leakage. Since the gate to source voltage of cell 212 with this set of voltages applied to it results in a gate to source voltage of zero, the cell remains off.

Another bitline 208 is shown in a state in which it carries data equal to one (1). For a bitline such as bitline 208, which is not programming its cells, its voltage is typically left floating. However, because of the adjustment to the voltages applied to the source and wordline of the cells in the unselected block 204, this non-programming bitline voltage is also adjusted in the present embodiment. In this embodiment, the voltage on the data equal to one (1) bitline 208 is fixed at 1.5 volts. With a floating voltage on the bitline 208, the cell 218 is prone to conducting in reverse direction though the cell 220 common to bitline 208 in selected block 202. Placing 1.5 volts on the bitline 208, in combination with the 2 volts on the wordline 214 and the source line 216 of the unselected block 204 results in a back bias on the cell 218 sufficient to shut off the cell from conducting in a reverse direction. Even though the gate to source voltage is on the order of 0.5 volts, the source to substrate voltage of 1.5 volts makes the cell unlikely to conduct.

The combination of voltages on unselected block wordlines, source lines, and programming and non-programming bitlines results in reducing the drain to gate voltage for cells along columns that are programming cells with data equal to zero (0) while reducing the possibility of leakages or other unwanted effects by controlling the voltages for cells along columns that are programming cells with data equal to one (1).

While specific voltages have been used for illustration, it should be understood that voltages are choosable within a range of voltages for the embodiments of the present invention. For example, the voltage of selected bitlines is in one embodiment within a range of 4 volts to 5 volts. The voltages of wordlines and the source for unselected blocks are in one embodiment within a range of 1.5 volts to 2.5 volts, to prevent erasure from the drain and current flow in the cells on unselected bitlines. The voltage on unselected bitlines is on one embodiment within a range of 0.5 volts to 2.5 volts, when the source voltage of unselected blocks is greater than or equal to 1 volt, to limit the reverse current in the cells of unselected erase blocks. The source voltage for selected blocks is in one embodiment within a range of 0.5 volts to 2 volts, to limit the current in the cells on unselected bitlines (data=1) on the selected row. The wordline voltage for unselected wordlines in selected blocks is in one embodiment within a range of 0 volts to 2 volts, provided it is less than or equal to the source voltage for the selected block, to avoid the flow of current in all respective cells. All of the voltage values given above are considered referenced to a p-type silicon substrate common for all of the cells in the respective erase blocks (common source).

Figure 3:
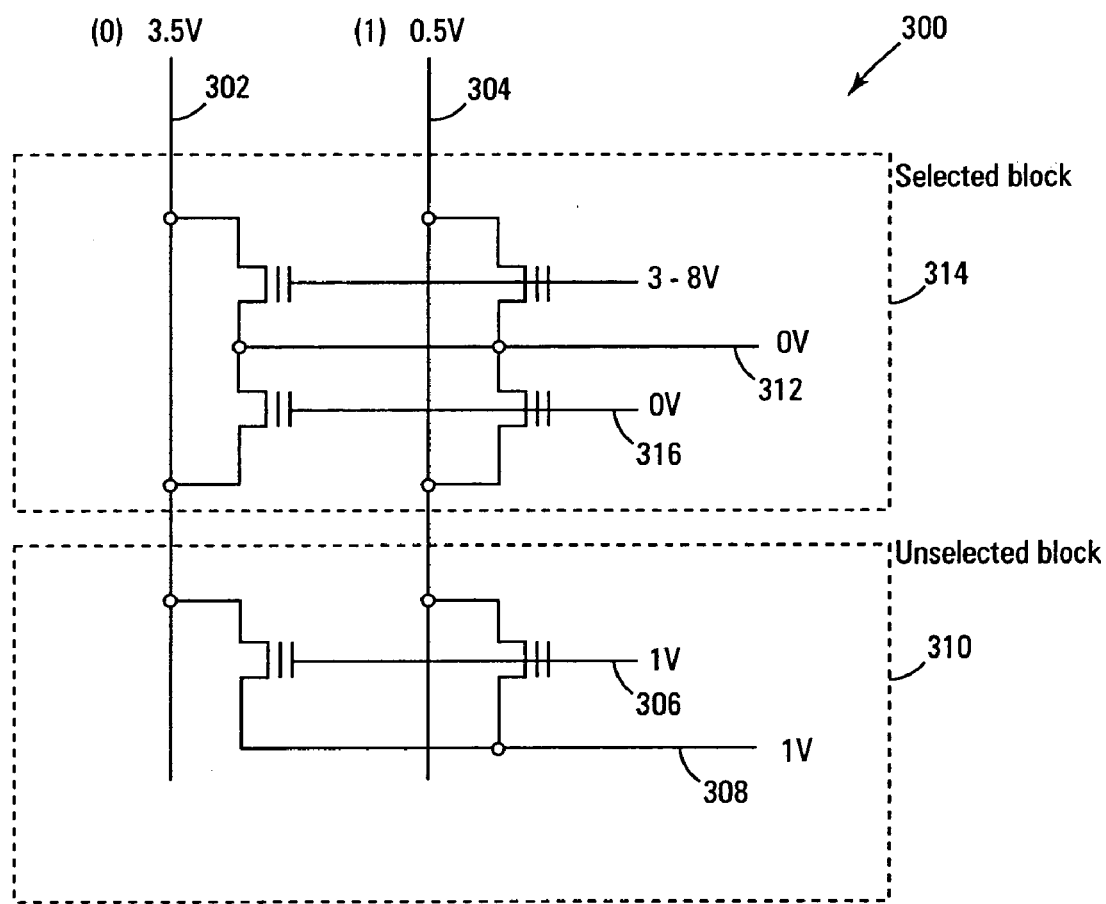
FIG. 3 is a circuit diagram of a portion of a memory according to another embodiment of the present invention.
Figure 2:
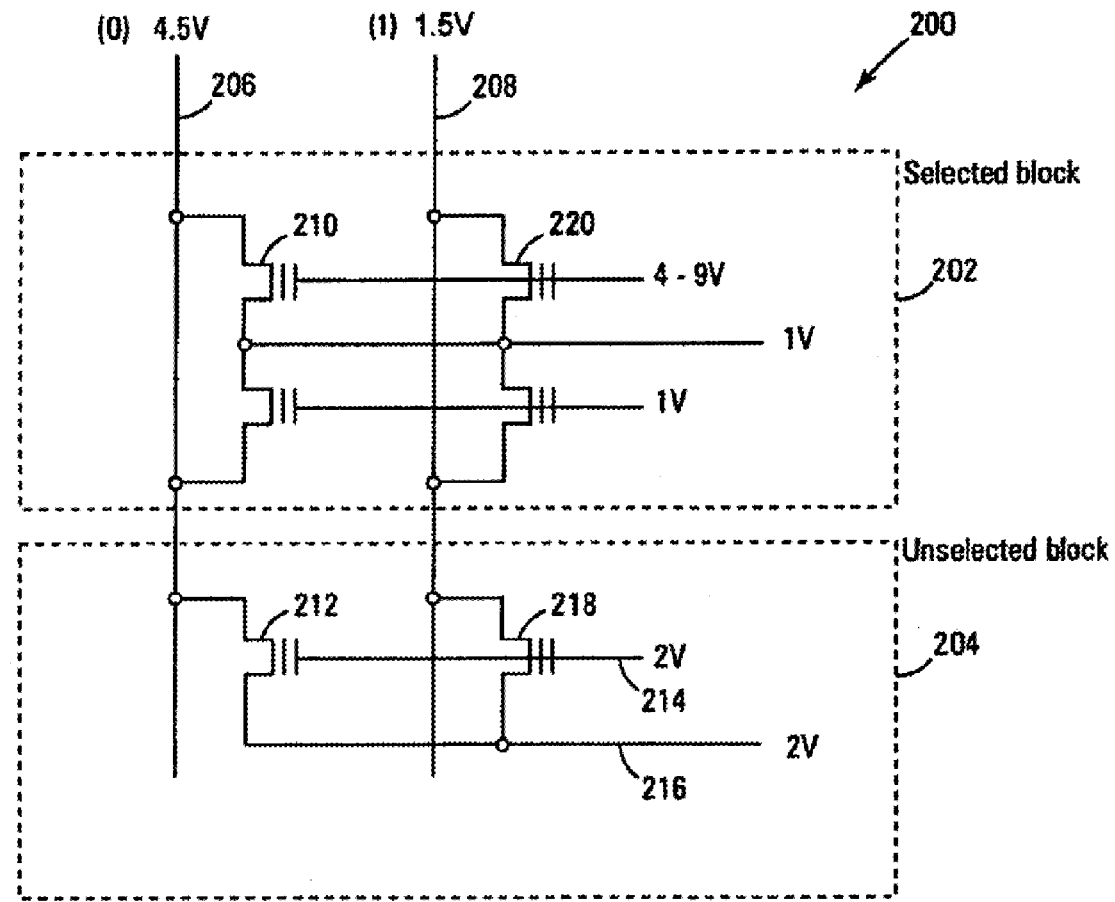

In another embodiment shown in FIG. 3, a circuit representation 300 in which voltages are applied to the various inputs of the selected and unselected blocks for reducing drain stress on unselected blocks in a flash memory is shown. In this substrate bias embodiment, the voltage of the substrate is held at a potential less than zero, $-Vsub$, by biasing the common substrate at a negative voltage $-Vsub$ with respect to the main ground line of the circuit. In this embodiment, the voltage values given with respect to FIG. 2 above are offset by $-Vsub$ when considered in reference to the main circuit ground. For example, for $-Vsub = -1$ volt, as is shown in FIG. 3.

Accordingly, biases in this embodiment on the lines are as follows. The voltage of selected bitlines such as bitline 302 are shown in FIG. 3 as 3.5 volts, and are in one embodiment within a range of 3 volts to 4 volts. The voltages of wordlines such as wordline 306 and the source such as source 308 for unselected blocks such as block 310 are shown in FIG. 3 as 1 volt, and are in one embodiment within a range of 0.5 volts to 1.5 volts. The voltage on unselected bitlines such as bitline 304 are shown in the Figure as 0.5 volts, and are in one embodiment within a range of $-0.5$ volts to 1.5 volts, when the source voltage of unselected blocks is greater than or equal to 0 volts. The source voltage such as source 312 for selected blocks such as block 314 is shown in FIG. 3 as 0 volts, and is in one embodiment within a range of $-0.5$ volts to 1 volt. The wordline voltage such as for wordline 316 for unselected wordlines in selected blocks is shown in FIG. 3 as 0 volts, and is in one embodiment within a range of $-1$ volt to 1 volt, provided it is less than or equal to the source voltage for the selected block. All of the voltage values given above are considered referenced to a p-type silicon substrate common for all of the cells in the respective erase blocks (common source).

In each of the above embodiments 200 and 300, the method of programming using the bias scheme uses a positive bias between the source of the row selected for programming and the common substrate. Such bias provides a relatively high program efficiency at low drain current per cell, and relatively low wordline voltage. Therefore, the method of programming described herein can be applied in conjunctions with a page mode write function by which a plurality of cells on the selected row are programmed simultaneously.

A command module or control circuitry model is used in various embodiments to provide the appropriate potentials to the inputs, such as source, gate, and drain regions of memory cells and blocks, and to selected and non-selected bitlines.

It should be understood that the voltages discussed above are used for purposes of illustration for a specific type of flash memory. Other types of flash memory may have different supply and programming voltages, and therefore the concepts of the present embodiments, namely adjusting the wordline, source line, programming and non-programming bitline voltages, as well as the substrate voltages, allow for the embodiments of the present invention to be practiced on other memories. The adjustment of voltages to reduce drain to gate stress and unwanted currents will be understood by those of skill in the art.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

CONCLUSION

A method and circuit for reducing drain to gate stress during programming in a flash memory has been described that includes adjusting the voltages on selected unselected wordlines, source voltages, drain voltages, and bitlines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a flash memory, comprising:
raising a gate voltage to a first potential difference below a bitline potential;
controlling a drain to gate voltage on cells on a selected bitline of a non-selected block; and
back biasing cells in non-selected blocks to reduce current leakage from unselected source blocks to selected source blocks.

2. The method of claim 1, wherein controlling a drain to gate voltage comprises raising a source voltage for source regions of non-selected blocks to the first potential difference below the bitline potential.

3. The method of claim 2, wherein the first potential difference is approximately 2.5 volts.

4. The method of claim 1, wherein the first potential difference is approximately 2.5 volts.

5. The method of claim 1, wherein back biasing comprises raising a bitline voltage of non-selected bitlines.

6. The method of claim 5, wherein raising the bitline voltage comprises raising the voltage to a level within a range of approximately 0.5 volts to 2 volts.

7. The method of claim 5, wherein raising the bitline voltage comprises raising the voltage to a level of approximately 1.5 volts.

8. A method of programming a flash memory, comprising:
raising a gate voltage to a first potential;
controlling a drain to gate voltage on cells on a selected bitline of a non-selected block; and
back biasing cells in non-selected blocks to reduce current leakage from unselected source blocks to selected source blocks.

9. The method of claim 8, wherein the first potential is within a range of approximately 1.5 to 2.5 volts.

10. The method of claim 8, wherein controlling a drain to gate voltage comprises raising a source voltage for source regions of non-selected blocks to the first potential.

11. The method of claim 10, wherein the first potential is within a range of approximately 1.5 to 2.5 volts.

12. A method of programming a flash memory, comprising:
raising a gate voltage to approximately 2.5 Volts below a bitline potential;
raising a source voltage for source regions of non-selected blocks approximately 2.5 Volts below the bitline potential; and
back biasing cells in non-selected blocks to reduce current leakage from unselected source blocks to selected source blocks.

13. A method of programming a flash memory, comprising:
raising a gate voltage to approximately 1.5 to 2.5 Volts;
raising a source voltage for source regions of non-selected blocks to approximately 1.5 to 2.5 Volts; and
back biasing cells in non-selected blocks to reduce current leakage from unselected source blocks to selected source blocks.

14. A method of programming a flash memory, comprising:
adjusting bitline voltages on non-selected bitlines;
adjusting drain, gate, and source voltages on selected and unselected memory blocks to reduce stress on memory cells in a column having selected bitlines, and to reduce current leakage from non-selected source blocks to selected source blocks.

15. A method of programming a flash memory, comprising:
reducing drain stress on unselected blocks in the memory;
reducing current leakage from unselected source blocks to selected source blocks during programming; and
applying a negative or 0 voltage to a common substrate of the memory.

* * * * *

UNITED STATES PATENT AND TRADEMARK OFFICE
CERTIFICATE OF CORRECTION

PATENT NO. : 7,215,571 B2
APPLICATION NO. : 10/931689
DATED : May 8, 2007
INVENTOR(S) : Andrei Mihnea and Vinod Lakhani It is certified that error appears in the above-identified patent and that said Letters Patent is hereby corrected as shown below:

Replace Fig. 2 of the drawings with the attached Fig. 2 replacement drawing.

Signed and Sealed this

Twenty-ninth Day of January, 2008

JON W. DUDAS
*Director of the United States Patent and Trademark Office*